United States Patent
Johnson et al.

(10) Patent No.: US 11,286,355 B2
(45) Date of Patent: Mar. 29, 2022

(54) COMPOSITE ARTICLE

(71) Applicant: 3M INNOVATIVE PROPERTIES COMPANY, St. Paul, MN (US)

(72) Inventors: Benjamin A. Johnson, Woodbury, MN (US); Terry R. Hobbs, Stillwater, MN (US); Patrick J. Kilps, Hubertus, WI (US); Patrick R. McKellips, Stillwater, MN (US); Ambuj Sharma, St. Paul, MN (US); Jeffrey M. Smits, Fond du Lac, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 36 days.

(21) Appl. No.: 16/645,814

(22) PCT Filed: Sep. 20, 2018

(86) PCT No.: PCT/US2018/051991
§ 371 (c)(1),
(2) Date: Mar. 10, 2020

(87) PCT Pub. No.: WO2019/060572
PCT Pub. Date: Mar. 28, 2019

(65) Prior Publication Data
US 2020/0277457 A1    Sep. 3, 2020

Related U.S. Application Data

(60) Provisional application No. 62/562,098, filed on Sep. 22, 2017.

(51) Int. Cl.
*C08J 5/06* (2006.01)
*C08L 83/10* (2006.01)
(Continued)

(52) U.S. Cl.
CPC ............. *C08J 5/06* (2013.01); *A62B 9/00* (2013.01); *C08L 83/10* (2013.01); *H01M 50/50* (2021.01);
(Continued)

(58) Field of Classification Search
CPC . A62B 17/04; C08L 55/02; H01B 1/22; C08J 5/06
See application file for complete search history.

(56) References Cited

U.S. PATENT DOCUMENTS

| 4,596,670 A | 6/1986 | Liu |
| 5,034,157 A * | 7/1991 | Merrell ............ H01B 1/22 252/512 |

(Continued)

FOREIGN PATENT DOCUMENTS

| CN | 106433070 | 2/2017 |
| WO | WO 1984-01783 | 5/1984 |

(Continued)

OTHER PUBLICATIONS

"SABIC's Tough LNP™ FARADEX™ Compound Helps Biomarine Enhance Safety and Durability of its BioPak240R Revolution Rebreather", Dec. 12, 2020, [online], [retrieved from the internet on May 7, 2020], <https://www.pressreleasefinder.com/SABIC/SABICIPPR244/en/>, 4 pages.

(Continued)

*Primary Examiner* — Khanh T Nguyen
(74) *Attorney, Agent, or Firm* — Steven A. Bern; Dena M. Ehrich

(57) ABSTRACT

There is provided a composite article comprising a composite material comprising 60 wt % to 98 wt % of a hydrolytically stable thermoplastic resin; and 1 wt % to 11 wt % long conductive metal fibers coated with a polymer selected from at least one of aromatic polycarbonates, aromatic polycar- (Continued)

bonate alloys, aromatic polyethers, maleated polyolefins, semi-aromatic nylons, stabilized nylons, and combinations thereof.

20 Claims, 6 Drawing Sheets

(51) Int. Cl.
  *A62B 9/00*    (2006.01)
  *H01M 50/50*   (2021.01)
(52) U.S. Cl.
  CPC ........ *C08J 2383/10* (2013.01); *C08J 2469/00* (2013.01); *H01M 2220/30* (2013.01)

(56) References Cited

U.S. PATENT DOCUMENTS

| | | | |
|---|---|---|---|
| 6,248,262 B1 | 6/2001 | Kubotera | |
| 6,399,737 B1 | 6/2002 | Elkovitch | |
| 7,303,822 B1 | 12/2007 | Matsouka | |
| 8,399,546 B2 | 3/2013 | Li | |
| 2003/0089892 A1 | 5/2003 | Fox | |
| 2003/0173550 A1 | 9/2003 | Fox | |
| 2003/0228932 A1 | 12/2003 | Ehlers | |
| 2007/0105994 A1 | 5/2007 | Li | |
| 2007/0129492 A1 | 6/2007 | Colborn | |
| 2007/0191518 A1 | 8/2007 | Chen | |
| 2008/0009576 A1* | 1/2008 | Alexander | C08L 55/02 524/407 |
| 2008/0033083 A1 | 2/2008 | Li | |
| 2008/0221241 A1 | 9/2008 | Junk | |
| 2011/0265790 A1* | 11/2011 | Walker | A62B 17/04 128/201.23 |
| 2013/0035441 A1 | 2/2013 | De Brouwer | |
| 2013/0309474 A1 | 11/2013 | Peek | |
| 2013/0313493 A1 | 11/2013 | Wen | |
| 2014/0097016 A1 | 4/2014 | Miyake | |
| 2016/0009881 A1 | 1/2016 | Fujita | |
| 2017/0001336 A1 | 1/2017 | Tamai | |

FOREIGN PATENT DOCUMENTS

| | | |
|---|---|---|
| WO | WO 2002-37507 | 5/2002 |
| WO | WO 2002-45098 | 6/2002 |
| WO | WO 2002-059205 | 8/2002 |
| WO | WO 2007-149663 | 12/2007 |
| WO | WO 2009-040772 | 4/2009 |
| WO | WO 2009-040774 | 4/2009 |
| WO | WO 2011-014778 | 2/2011 |
| WO | WO 2012-160540 | 11/2012 |
| WO | WO 2013-067684 | 5/2013 |
| WO | WO 2013-108102 | 7/2013 |
| WO | WO 2013-130610 | 9/2013 |
| WO | WO 2013-171714 | 11/2013 |
| WO | WO 2014-049572 | 4/2014 |
| WO | WO 2015-193860 | 12/2015 |
| WO | WO 2016-170468 | 10/2016 |
| WO | WO 2017-019969 | 2/2017 |

OTHER PUBLICATIONS

Bruhwiler, "Comparison of quasistatic to impact mechanical properties of multiwall carbon nanotube/polycarbonate composites", Journal of Material Research, Jun. 2010, vol. 25, No. 6, pp. 1118-1130.
International Search Report for PCT International Application No. PCT/US18/51991, dated Dec. 10, 2018, 3 pages.
Extended EP Search Report, EP 18858847.9, dated Jul. 28, 2021, 8 pages.

* cited by examiner

COMPOSITE ARTICLE

CROSS REFERENCE TO RELATED APPLICATIONS

This application is a national stage filing under 35 U.S.C. 371 of PCT/US2018/051991, filed Sep. 20, 2018, which claims the benefit of U.S. Provisional Application No. 62/562,098, filed Sep. 22, 2017, the disclosure of which is incorporated by reference in its/their entirety herein.

FIELD

The present invention relates to a composite article, such as a powered air purifying respirator (PAPR), made using a composite material.

BACKGROUND

When working in areas where there is known to be, or there is a risk of there being, dusts, fumes or gases that are potentially hazardous or harmful to health, it is usual for the worker to use a respirator. A common type of respirator used in such circumstances is a powered air purifying respirator (PAPR). A PAPR has a blower system comprising a fan powered by an electric motor for delivering a forced flow of air to the respirator user. A turbo unit is a housing that typically contains the blower system, and is adapted to connect a filter to the blower system. Air is drawn through the filter by the blower system and passed from the turbo unit through a breathing tube to a headpiece, for example, a helmet or headtop, thus providing filtered air to the user's breathing zone (the area around their nose and mouth). A blower system for a PAPR may also include an electronic control unit to regulate the power driving the fan. Typically, a single power supply, for example a battery, provides power for both the fan and the electronic control unit.

Thermoplastic polymer composites are widely used industrially for a wide variety of products and applications, such as for example component parts useful in the aforementioned PAPRs. One of the key challenges with polymer composites is the ability to develop materials that are static dissipative, flame retardant, and have very good impact properties at low temperatures after aging at high temperature and high humidity. For example, U.S. Pat. No. 8,399,546 (Li et al.) describes flame retardant thermoplastic compositions having electromagnetic shielding. The compositions disclosed in this patent provide certain levels of EMI shielding effectiveness, along with a UL94 V0 or V1 flammability rating at a thickness of 1.5 mm (±10%). This patent does not disclose compositions that provide impact properties across a broad temperature and humidity ranges for parts made using such compositions.

CN106433070 (A) (Xiaolong et al.) describes a halogen free flame retardant polycarbonate material having electromagnetic shielding characteristics. This patent publication does not disclose compositions that provide certain UL flammability performance or impact properties across a broad temperature and humidity ranges for parts made using the materials disclosed therein.

U.S. Pat. Publ. No. 2014/0097016 A1 (Miyake) discloses an electromagnetic shielding material having improved delamination behavior. This patent publication does not disclose compositions that provide certain UL flammability performance or impact properties across a broad temperature and humidity ranges for parts made using the materials disclosed therein.

In some instances, it is desirable to provide a thermoplastic composite material that, when used to create these component parts, particularly component parts used in PAPRs, provides static dissipation on the surface of PAPR component parts while at the same time meeting UL flammability requirements for resulting PAPRs. It is also desirable to provide component parts for PAPRs that have suitable impact properties across a broad temperature range, such that these impact properties are maintained after prolonged exposure to elevated temperature and humidity levels. It is further desirable to provide a low mass or light weight PAPR created using component parts formed from such thermoplastic resins that can be run at greater than 30 watts of power while meeting the aforementioned requirements.

SUMMARY

The present disclosure provides a unique thermoplastic composite material that is static dissipative, flame retardant, hydrolytically stable, dimensionally stable, and has superior impact properties at low temperatures (less than −20 degrees Celsius). Such materials are very useful for molding parts and articles that can be used in intrinsically safe respirators, electronic materials, safety equipment, and personal respirators.

In one aspect, the present invention provides a composite article comprising a composite material comprising 60 wt % to 98 wt % of a hydrolytically stable thermoplastic resin; and 1 wt % to 11 wt % long conductive metal fibers coated with a polymer selected from at least one of aromatic polycarbonates, aromatic polycarbonate alloys, aromatic polyethers, maleated polyolefins, semi-aromatic nylons, stabilized nylons and combinations thereof. In some embodiments, the long conductive metal fibers comprise long stainless steel fibers. In some embodiments, the hydrolytically stable thermoplastic resin is selected from at least one of stabilized aliphatic nylons, semi-aromatic nylons, aromatic polyethers, and hydrolytically stable polycarbonate alloys. In some embodiments, the hydrolytically stable thermoplastic resin comprises polycarbonate-polysiloxane copolymer.

In some embodiments, the polymer used to coat the long conductive metal fibers comprises bisphenol A polycarbonate polymer or copolymers. In some embodiments, the long conductive metal fibers are >1 mm in length. In some embodiments, the long conductive fibers have an L/D ratio greater than or equal to 100.

In some embodiments, the composite material further comprises an impact modifier or maleated polyolefin. In some embodiments, the composite material further comprises carbon black, adhesion promoters, or adhesion promoting polymers. In some embodiments, the composite material further comprises particles or glass fibers. In some embodiments, the composite material further comprises particles or carbon fibers. In some embodiments, the composite material further comprises a brominated bisphenol A polymer. In some embodiments, the composite material further comprises a flame retardant.

In some embodiments, an outer surface of the composite article has a surface resistance less than or equal to 109 ohm measured at 50±5% relative humidity, or has a surface resistance less than or equal to 1011 ohm measured at 30±5% relative humidity when measured in accordance with IEC 60079-0 Section 26.13. In some embodiments, at least one surface of the composite article comprises long conductive metal fibers aligned in a radial pattern, and further wherein the radial pattern covers greater than 50% of the surface area of the composite article.

In some embodiments, at least one surface of the composite article comprises long conductive metal fibers aligned predominately in one direction on at least one surface. In some embodiments, the composite article meets IEC 60079 Test.

In some embodiments, the composite article is least a portion of a powered air purifying respirator. In some embodiments, the composite article comprises at least a portion of an intrinsically safe powered air purifying respirator. In some embodiments, the composite article comprises a portion of an intrinsically safe gas meter or gas detection device. In some embodiments, the composite article comprises a portion of an electrical battery pack.

The above summary of the present disclosure is not intended to describe each embodiment of the present invention. The details of one or more embodiments of the invention are also set forth in the description below. Other features, objects, and advantages of the invention will be apparent from the description and from the claims.

BRIEF DESCRIPTION OF THE DRAWINGS

By way of example only, embodiments of the invention will now be described below with reference to the accompanying drawings, in which.

DETAILED DESCRIPTION

Figure 1:
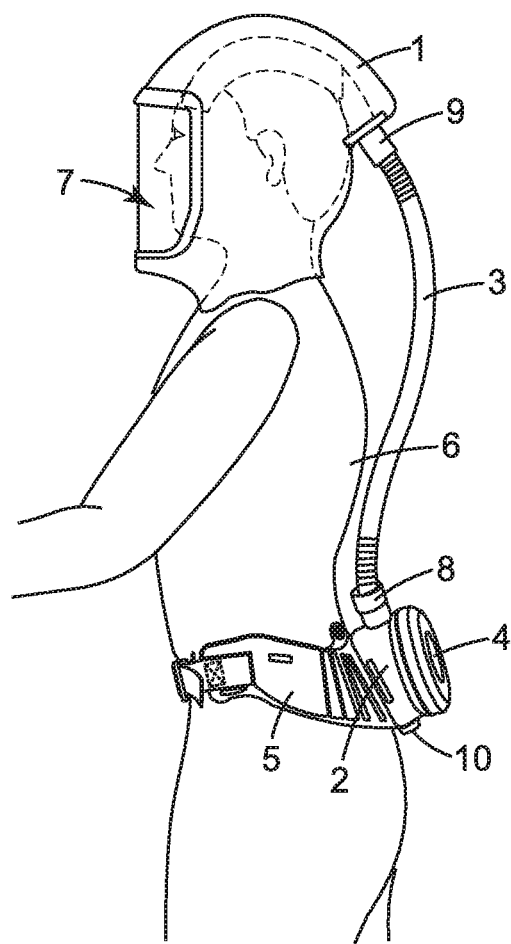
FIG. 1 is a diagrammatical illustration of a powered air purifying respirator.

Before any embodiments of the invention are explained in detail, it is to be understood that the invention is not limited in its application to the details of construction and the arrangement of components set forth in the following description. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Any numerical range recited herein includes all values from the lower value to the upper value. For example, if a percentage is stated as 1% to 50%, it is intended that values such as 2% to 40%, 10% to 30%, or 1% to 3%, etc., are expressly enumerated. These are only examples of what is specifically intended, and all possible combinations of numerical values between and including the lowest value and the highest value enumerated are considered to be expressly stated in this application.

In the present detailed description of the preferred embodiments, reference is made to the accompanying drawings, which illustrate specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "proximate," "distal," "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above or on top of those other elements.

As used herein, when an element, component, or layer for example is described as forming a "coincident interface" with, or being "on," "connected to," "coupled with," "stacked on" or "in contact with" another element, component, or layer, it can be directly on, directly connected to, directly coupled with, directly stacked on, in direct contact with, or intervening elements, components or layers may be on, connected, coupled or in contact with the particular element, component, or layer, for example. When an element, component, or layer for example is referred to as being "directly on," "directly connected to," "directly coupled with," or "directly in contact with" another element, there are no intervening elements, components or layers for example.

The phrase "intrinsically safe powered air purifying respirator" as used herein means that the PAPR meets the requirements of the Underwriter Laboratories, UL 60079-11 Standard for Safety [Explosive Atmospheres—Part 11: Equipment Protection by Intrinsic Safety "i"].

The term "polymer" as used herein includes homopolymers and co-polymers.

As used herein, the phrase "hydrolytically stable thermoplastic resin" means a resin that retains greater than or equal to 50% of its original impact strength at 23 degrees Celsius after aging at 80 degrees Celsius and 90% relative humidity for 28 days. Impact strength can be measured by various ASTM or ISO methods, including but not limited to the Izod impact methods (ASTM D256, ASTM D4812, ISO 180/1A, ISO 180/1U), Charpy impact methods (ASTM D6110, ISO 179/1eA, ISO 179/1eU) and the falling dart methods (ASTM D3763, ASTM5628, ISO6603). Hydrolytically stable polymers may show loss of molecular weight after aging, such as exposure to temperatures above 35 degrees C. and/or humidity above 60% relative humidity, but still have sufficient molecular weight to have very good mechanical properties including impact strength at different temperatures. Typically, hydrolytically stable polymers have lower impact strength at lower temperatures and this can and often is a limiting factor in designing parts and systems that meet widely accepted standards. Impact strength and the ability to resist fracture or cracking after incidental hits or being dropped are extremely important features to have with safety equipment to ensure that safety equipment itself does not create a hazardous situation for the user.

As used herein, the phrase "turbo housing enclosure" means an enclosure defined by the structure of the turbo unit, specifically the front and rear turbo housings in combination with the electronic control unit, outlet, and battery connector.

As used herein, the phrase "battery housing enclosure" means an enclosure defined by the structure of the battery pack, specifically a battery lid and battery a battery housing in combination with electrical components, and with battery cells.

As used herein, the phrase "battery connector enclosure" means an enclosure defined by a volume trapped between the battery connector of the turbo unit, and corresponding mating receptacle of the battery pack when fully engaged and fastened together.

FIG. 1 is a diagrammatical illustration of a powered air purifying respirator ("PAPR"). The PAPR comprises a headpiece 1, a turbo unit 2, a breathing tube 3, a filter 4 and a belt 5. Headpiece 1 is worn on the user's 6 head. It at least partially encloses the user's 6 head to form a breathing zone 7, that is, the area around their nose and mouth, so that the filtered air is directed to this breathing zone 7. Turbo unit 2 may be attached to a belt 5 to enable it to be secured about the user's 6 torso. Turbo unit 2 houses a blower system (not shown), which draws the air through the PAPR system using a fan (also not shown). Turbo unit 2 supplies air to headpiece 1 through breathing tube 3, which is connected between outlet 8 of turbo unit 2 and inlet 9 of headpiece 1. Turbo unit 2 is fitted with a filter 4, which can be either inside turbo unit 2 or attached to turbo unit 2 as shown in FIG. 1 such that filter 4 is in an airflow path, preferably disposed upstream of a fan opening of the blower. The purpose of providing filter 4 is to remove particles and/or gases and/or vapors from the ambient air before the air is delivered to user 6. A battery pack 10, which is fitted to turbo unit 2 provides power to an electronic control unit 23 and to a motor 22 (both shown in FIG. 2 as discussed below).

Headpiece 1 may have a variety of configurations. Although a hood is illustrated in FIG. 1, headpiece 1 could be a helmet, a mask, or a full suit, provided it covers at least the orinasal area of the user's face, to direct air to user's 6 breathing zone 7. Full face respirators or half face mask respirators may be used as headpieces in conjunction with the embodiment of the present invention. Alternative ways of supporting turbo unit 2 on a user's 6 body or otherwise are also within the scope of the present disclosure. For example, a backpack-type support may be provided for turbo unit 2.

A PAPR may also be designed with smaller and lighter batteries, and smaller and lighter or lower profile filters. Turbo unit 2 may be fitted with more than one filter 4 in the airflow path, to remove particles and/or gases and vapors from the ambient air before the air is delivered to user 6. Filter(s) 4 may be inside turbo unit 2 or fitted to the outside of turbo unit 2. Battery 10, may be attached to turbo unit 2 as illustrated in FIG. 1 or may be remote from turbo unit 2 and connected by a suitable cable.

The following illustrates how the blower system in accordance with some embodiments of the present disclosure may operate. In the following examples, the structural components of the PAPR may be assumed to be as described above with reference to FIGS. 1 and 2.

Figure 2:
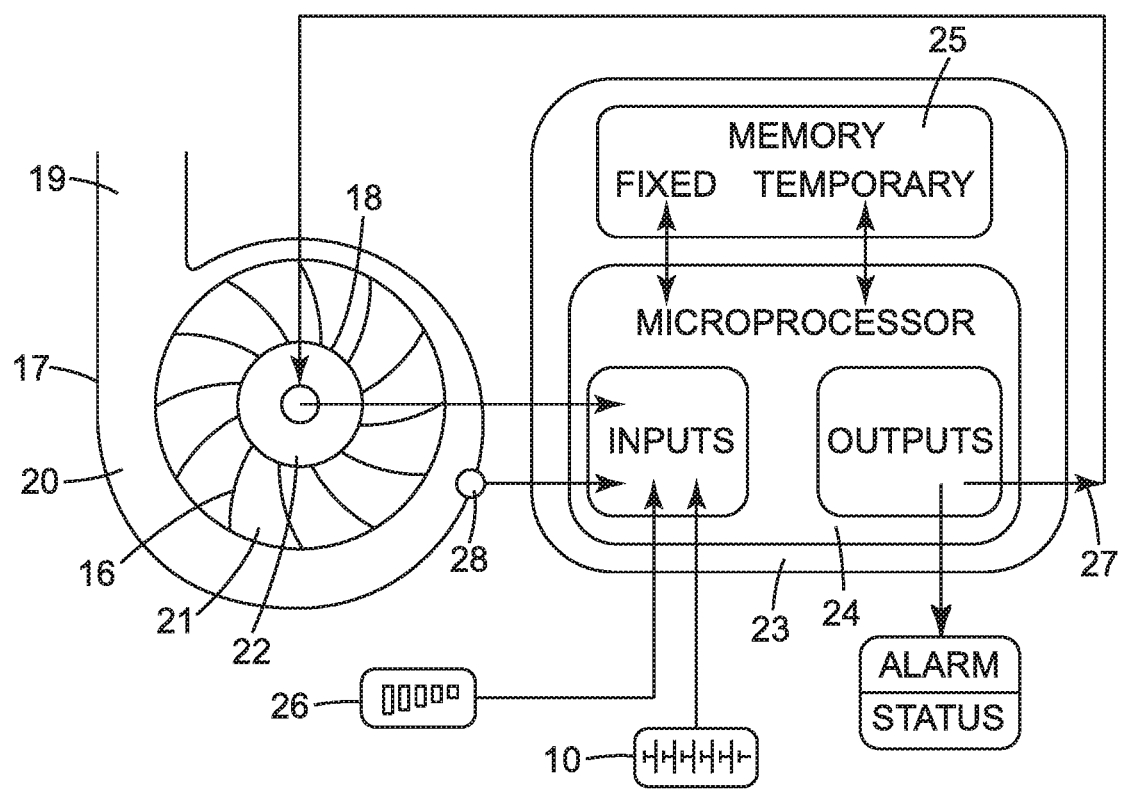
FIG. 2 shows a block diagram of a blower system according to a first embodiment of the present disclosure.

FIG. 2 shows a block diagram of a blower system according to a first embodiment of the present disclosure. The blower system is housed within turbo unit 2 as, for example, illustrated in FIG. 1. In some embodiments, a blower 20 includes a housing 17 having an inlet 18 and an outlet 19. Blower 20 includes a fan 21, having a plurality of blades 16, driven by a motor 22. Blower 20 is controlled by electronic control unit 23, which regulates the power provided from a power supply (such as battery 10 as depicted in FIG. 1) to motor 22. In some embodiments, the power supply is a battery, an electric cord that can be plugged into a power outlet, a solar cell, and the like. In some embodiments, the blower system includes a battery connector 29 located between the battery 10 and the electronic control unit 23. In some embodiments, a preferred power supply is a battery containing gas gauging circuitry, such as batteries that use standard System Management Bus ("SMBus") communications to provide an input 26 to microprocessor device 24. Exemplary commercially available SMBus gas gauges are available under the trade designation "TI BQ20Z90" from Texas Instruments Inc. Dallas, Tex. USA. In some embodiments, the power supplied from power supply to motor 22 is an electrical characteristic, such as for example, voltage.

Referring to FIG. 2, the blower system comprises electronic control unit 23 that functions to maintain a substantially uniform, preferably constant, volumetric airflow to headpiece 1. Electronic control unit 23 comprises: a microprocessor device 24, such as a single chip microcontroller, for computing information; a memory device 25, such as flash RAM, for storing information; inputs to microcontroller include data from sensors such as motor current sensors and fan speed sensors 28, battery gas gauge 26 and voltage provided by battery 10; and an output controller 27, such as a pulse width modulation controller chip, for providing power to motor 22 and any alarm or status indicators, such as buzzers or light emitting diodes, that may be included in the PAPR. Memory device 25 of electronic control unit 23 has two parts: a fixed memory and a temporary memory. The fixed memory is populated with data, for example, at the time of manufacture, comprising the algorithms and programs for enabling microprocessor 24 to carry out its calculations and procedures, and calibration information from the factory calibration procedure. The temporary memory is used for storing data and information such as sensor readings and fan operating parameter data collected during start-up and running of turbo unit 2. If desired, this data maybe erased when turbo unit 2 is powered down.

In some embodiments, a three-phase square-wave, brushless, direct current motor 22 may be used to drive fan 21 of blower 20. The equations below, EQ.1, EQ.2 and EQ.3 are well known and show the relationships between the main parameters of such a motor.

$$T = k_T I \qquad \text{(Eq. 1)}$$

$$E = k_E \frac{2\pi}{60} n \qquad \text{(Eq. 2)}$$

-continued $V_s = E + R_m I$ (Eq. 3)

$T$ Air gap torque ($mNm$)
$k_T$ Torque constant ($mNm/A$)
$I$ Motor current ($A$)
$E$ Back $EMF(V)$
$k_E$ Back $EMF$ constant ($Vs$/rad)
$n$ Speed (rpm)
$V_s$ Applied motor voltage (V)
$R_m$ Winding resistance ($\Omega$)

Motor 22 used in the embodiments described above is a three-phase square-wave brushless direct-current motor. Alternatively, a segmented commutator brushed direct current motor may be used. Equations EQ.1, EQ.2 and EQ.3 are known to be true for both the brushed and brushless types of motors. Consequently, most types of direct current motors known within the respirator industry could be used in presently disclosed blower 20. Other non-direct current types of motors that are known for PAPR applications may also be used. Alternative motor control methods, such as pulse width modulation are also envisaged as being within the scope of the present invention.

As explained above, blower 20 comprises a fan 21, which is used to move air through filter(s) 4 and deliver it to user 6. Fan 21 illustrated in the drawings is of the type often known as a centrifugal or radial fan, meaning that the air enters the fan in the direction of the fan axis and exits in a radial direction to the fan.

Still referring to FIG. 2, fan speed is measured by means of a sensor 28 fitted to blower 20 that measures the number of revolutions of fan 21 in a given time. A suitable type of sensor for measuring the fan speed would be a Hall effect device, although other types of sensor could be used. The fan speed 28 information is received by microprocessor device 24 of electronic control unit 23. Output to controller 27 can be voltage applied to electric motor 22.

In some embodiments, air should be delivered to user 6 at a predetermined substantially uniform volumetric airflow. In certain circumstances, however, user 6 may need to be able to adjust the airflow to a different level. For example, if user 6 is working particularly hard and breathing more deeply or at a faster rate than usual, they may desire to increase the airflow. To enable this, in some embodiments, electronic control unit 23 is provided with a discrete range of two, three or more different, pre-set airflow values. In some embodiments, electronic control unit 23 is provided with an algorithm that allows continuous monitoring and varying of the airflow rate at various airflow values. However, electronic control unit 23 is usually set such that it is not possible for user 6 to inadvertently reduce the airflow below a level where the minimum protection is given.

The term "processor," or "controller" as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

Figure 4:
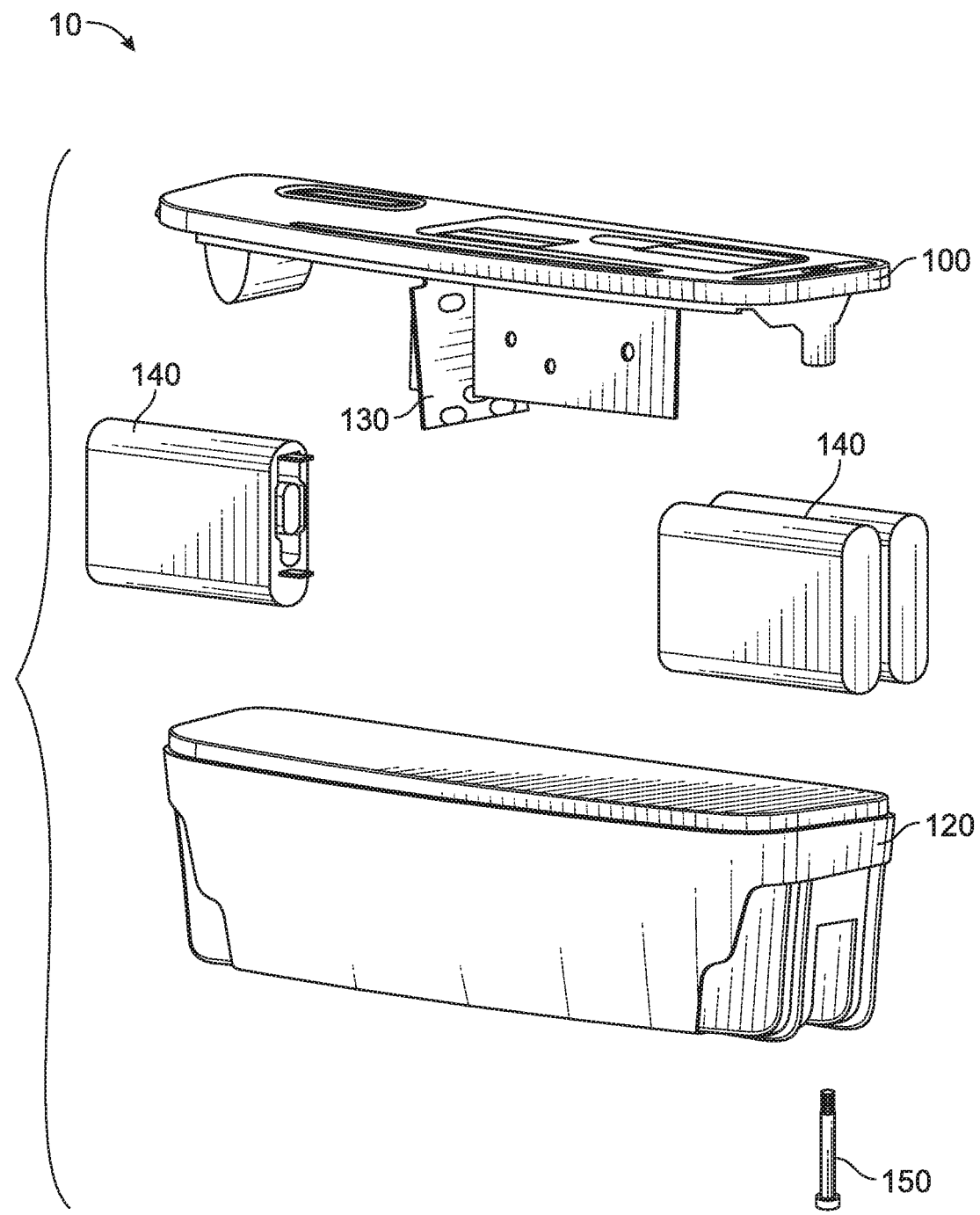
FIG. 4 is an exploded perspective view of battery connector 29 disclosed in FIG. 2.
Figure 5:
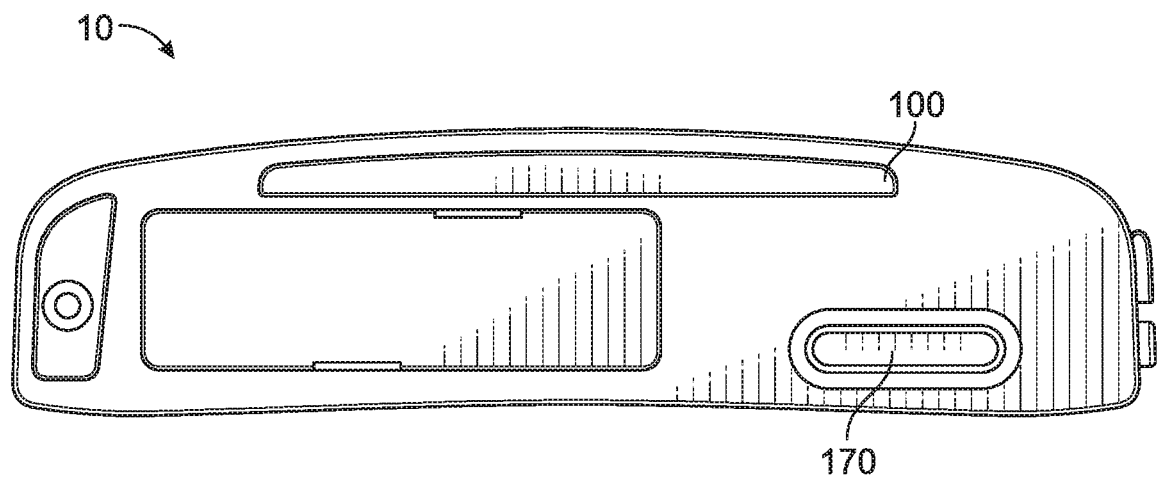
FIG. 5 is a top view of battery connector 29 disclosed in FIG. 2.

Referring now to FIGS. 4 and 5, there is shown a battery 10 useful to be connected to electronic control unit 23 (both as shown in FIG. 2). In some embodiments, battery 10 comprises a battery lid 100 operatively connected to electrical components 130. A battery cell 140 can be removably attached to at least a portion of the electrical components 130. A battery housing 120 is removably connected to battery lid 100 and thereby containing electrical components 130 and battery cells 140. In some embodiments, fastener 150 is used to connect battery 10 to turbo 2 (both shown in FIG. 1). In some embodiments, battery lid 100 includes a mating receptacle 170 useful for operatively connecting battery 10 to other components in the blower system.

Thermoplastic polymer composites are widely used industrially for a wide variety of products and applications, such as for example component parts useful in the aforementioned PAPRs. One of the key challenges with polymeric materials and polymer composites is the ability to develop materials that are static dissipative, flame retardant, and which also have good impact properties at low temperatures after aging at high temperature and high humidity. These design requirements are known for materials that are used in safety equipment that is to be UL listed. It is fairly easy to achieve antistatic properties in a polymeric material by adding low molecular weight organic additives or hydrophilic polymers. However, with exposure to high humidity and high temperatures over an extended period of time, materials using such low molecular weight organic additives or hydrophilic polymers generally decompose and often attack the polymer that they are added to, which causes discoloration, loss of mechanical properties, and dimensional instability or swelling. It is difficult to develop polymeric articles with low temperature impact properties, because most polymers show a decline in impact strength below 0 degrees Celsius. Polymer composites that are composed of long inorganic fibers generally have good impact strength. However, these polymer composite materials require a significant volume fraction of fibers to achieve such impact strength and the resulting materials are often brittle when molded into articles because the fibers in certain geometries cause a complex state of stress, resulting in non-ductile deformation of the article and mechanical failure at low strains.

Most plastics and polymeric materials are excellent electrical insulators and as a result any surface charge developed on a plastic part will dissipate slowly. Antistatic agents are well known and are divided into internal and external agents. Internal agents are additives that mixed into the bulk of the plastic and external agents are added to the surface of the part after molding. Various conductive fillers and reinforcements can be used as antistatic additives. These include carbon black, carbon fibers, metal fibers, metallized glass fibers, and aluminum flakes. Stainless steel fiber concentrations of 2 to 5 weight percent have been shown to be effective in static dissipative applications. However, use of these fibers in this amount, along with the addition of other conductive antistatic agents, is known to cause a decline in the notched Izod impact test, especially for polycarbonate host resins (see table 9 on page 472 of Engineering Plastics).

The addition of carbon fibers to polycarbonate host resins provides even more inferior impact properties because the static dissipative threshold for carbon fibers is higher compared to stainless steel fibers. Furthermore, carbon fibers are considerably more brittle than stainless steel fibers, resulting in low impact properties in the finished part or article.

Without being bound by theory, it is believed that the fiber interphase in conventional composite materials has a significant effect on the mechanical properties of composite articles formed therefrom, particularly impact strength retention after exposure to humidity and/or wet environments. For example, silane coupling agents were developed during the 1950's for improving performance of glass reinforced plastics and thermosets. Silane coupling agents react with glass fiber surfaces and form a dense region of material at the fiber surface that provides a way to covalently bond the glass fiber to polymer matrix. The fiber interphase is defined as the material within 300 nm of the fiber surface.

Very little information has been published on the mechanical properties or impact properties of composite materials using metal fibers, such as for example stainless steel fibers. Again, without being bound by theory, one reason for this lack of information is that metal fibers, such as stainless steel fibers, when used at relatively low volume loadings, do not have a significant effect on strength or modulus or composite articles derived therefrom. For example, 5 wt % stainless steel fibers used in a static dissipative application are typically equivalent to a volume loading of 0.9% because of the high specific gravity of stainless steel. For comparison, most structural composites use a fiber volume loading of 40-65% to create a high strength material. At these volume fractions, composite articles made using these composite materials including stainless steel fibers would have an undesirably high density and would be very difficult to manufacture by conventional molding techniques such as injection molding or compression molding. Another consideration is that a 5 wt % loading of metal fibers, such as stainless steel fibers, in polycarbonate resin causes significant embrittlement according to notch Izod impact performance results especially at low temperatures below 0 degrees Celsius. This embrittlement issue is further exacerbated by decreasing temperature or exposure of the composite article to humidity at temperatures above 60 degrees Celsius. Many engineering polymers based on condensation polymerization, including conventional polycarbonates, polyesters, polyamides or nylons, and urethanes, degrade under these conditions resulting in significant loss of polymer molecular weight and mechanical properties. This phenomenon is well known. For example, conventional bisphenol A carbonate (commercially available under the trade designation "Lexan" from Sabic Innovative Plastics, Pittsfield, Mass.) is limited in use in many real-world applications, because extremes in humidity and temperature cause severe degradation and embrittlement. Aromatic polycarbonates, such as bisphenol A types of polycarbonates, are known to have very high impact strength compared to other engineering thermoplastics. However, this material property is lost after prolonged exposure to high humidity at elevated temperatures. The loss of impact strength due to hydrolysis is known to be temperature dependent and very pronounced at high temperatures, above 60 degrees C.

The present disclosure provides for a composite material created by coating long metal fibers, such as stainless-steel fibers, with selected thermoplastic polymers and then dispersing the long metal fibers uniformly in a hydrolytically stable thermoplastic resin, where the thermoplastic polymer has a different composition than the hydrolytically stable thermoplastic resin. Composite articles derived from these composite materials have superior impact properties to those made using conventional composite materials.

Polymers useful in the present disclosure as the hydrolytically stable thermoplastic resin include, but are not limited to, stabilized aliphatic nylons, semi-aromatic nylons, aromatic polyethers, and hydrolytically stable polycarbonate alloys. Polycarbonate alloys useful in the present disclosure include those sold under the trade designation "Xenoy" by Sabic, Innovative Plastics, Pittsfield, Mass., including but not limited to Xenoy 5720u. Hydrolytically stable nylons include semi-aromatic polyamides based on the condensation polymerization of terephthalic acid with aliphatic diamines. In some embodiments, a preferred polymer is a toughened grade of a semi-aromatic nylon. Hydrolytically stable nylons also include aliphatic nylons with additives that prevent or reduce hydrolysis of the polymer at elevated temperatures and high humidity. Hydrolytically stable nylons also include aliphatic nylons of longer chain length that are already known to have excellent hydrolytic stability, including, but not limited to, nylon 6, 12, nylon 12, nylon 4, 12 and formulations of these polymers with toughening agents, such as maleated polyolefins. In some embodiments, a preferred class of polymers for use as the hydrolytically stable thermoplastic resin is polycarbonate-polydimethylsiloxane copolymers. This class of polymers is known to have excellent ductility, improved hydrolytic stability, and improved impact properties compared to their polycarbonate homopolymer counterparts. These copolymers are commercially available under the trade designation "Lexan EXL" from Sabic Innovative Plastics, Pittsfield, Mass. Furthermore, these copolymers have outstanding low temperature impact properties. In addition, it is known that these copolymers have low adhesion to metal and plastic surfaces because of the PDMS group in the polymer backbone. Hence, these polymers are especially useful as a bulk matrix which is hydrolytically stable, but are not specifically useful for coating metal fibers due to the low adhesion.

Metal fibers useful in the present disclosure include any conductive metal fiber, such as steel, steel alloys, copper, copper alloys, aluminum, aluminum alloys, silver, silver alloys, gold, gold alloys, titanium, titanium alloys, beryllium, beryllium alloys, and the like. Steel alloys include stainless steel. The term "long metal fibers" as used herein means that the metal fibers in the composite have a fiber aspect ratio (calculated as length divided by diameter (l/d)) of greater than or equal to 50, and preferably greater than or equal to 100, and a length of greater than or equal to 1 mm. In some embodiments, the un-coated metal fiber has a length of greater than or equal to 1 mm, preferably greater than or equal to 2 mm, and more preferably greater than or equal to 2.5 mm. In some embodiments, the un-coated metal fiber has an average diameter of greater than or equal to 4 micrometers, and preferably greater than or equal 11 micrometers. In some embodiments, the un-coated metal fiber has an average diameter of less than or equal to 60 micrometers, and preferably less than or equal to 20 micrometers.

In some embodiments, these metal fibers are coated, preferably individually coated, with a coating to provide uniform distribution of the coated metal fibers in the hydrolytically stable thermoplastic resin. The term "coated" as used herein with respect to coated metal fibers means that at least all of the major surfaces of the fiber are covered with a coating, such as a polymer. Polymers useful in the present disclosure for coating the metal fibers, such as for example stainless steel fibers, are polymers that are hydrophobic and aromatic and may have partial miscibility with the hydrolytically stable thermoplastic resin, such as the aforementioned PC-PDMS copolymer. In addition, the polymer for coating the steel fibers needs to have good adhesion to the metal fibers themselves. In some embodiments, polymers useful for coating the metal fibers include, but are not limited, semi-aromatic polyamides, aromatic polycarbonates, hydrolytically stable aromatic polyesters and copolyesters, aromatic polyethers, combinations thereof, and the like. In some embodiments, the presently disclosed composite article includes 1 wt % to 11 wt % long conductive metal fibers coated with a polymer selected from at least one of aromatic polycarbonates, aromatic polycarbonate alloys, aromatic polyethers, maleated polyolefins, semi-aromatic nylons, stabilized nylons, and combinations thereof. Polystyrene copolymers useful in the present disclosure include, but are not limited to, polystyrene maleic anhydride copolymers. Aromatic polycarbonates useful in the present disclosure include, but are not limited to, bisphenol A polycarbonates and copolymers of bisphenol A polycarbonates. Aromatic polyesters and copolyesters useful in the present disclosure include, but are not limited to, polyethylene naphthalate (PEN), wholly aromatic and partially aromatic liquid crystalline polyesters, polyarylates, and polyether esters. Aromatic polyethers useful in the present disclosure include, but are not limited to, polyether ketones, resins commercially available under the trade designation "Noryl" from Sabic, Innovative Plastics, Pittsfield, Mass., polyphenylene ethers, poly aryl ether nitriles, polyetherimides, and polymers derived from bisphenol A diepoxides.

In some embodiments, preferred polymers for coating the metal fibers include, but are not limited to: bisphenol based polymers including bisphenol A polycarbonate, halogenated bisphenol polyethers, bisphenol A epoxy copolymers, and bisphenol A copolyesters. In some embodiments, the polymer used to coat the long conductive metal fibers comprises bisphenol A polycarbonate polymer or copolymers. Other polymers that are useful as the presently disclosed coating material, methacrylate acrylonitrile copolymers, and alloys of aromatic polycarbonates such as those sold under the trade designation "Xenoy". Copolymers that contain acrylonitrile preferably have an acrylonitrile content greater than or equal to 5 wt %. Without being bound to a particular theory, it is believed that these polymers have good adhesion via adsorption to the surface of the metal fibers, such as stainless steel fibers, due to the chemical nature of the polymer which contains aromatic rings in conjunction with various groups (carbonate, OH, CN, and amides) of moderate polarity. In addition, polymers useful in the present disclosure for the coating the metal fibers should have good adhesion with the hydrolytically stable thermoplastic resin such that an interface formed between the resin and the polymer is reasonably strong due to molecular entanglement or interaction between them. The former mechanism provides for effective coupling of the metal fibers with the hydrolytically stable thermoplastic resin. As a result, an applied stress to a composite article derived therefrom is transferred to the metal fiber across various interfaces that are relatively strong. The coating on the metal fibers may further comprise a modified olefin as a compatibilizer or adhesion promoter. Modified olefins useful in the present disclosure include maleated copolymers and maleated polypropylene. Such olefins are particularly useful when used in conjunction with semi-aromatic polyamides. In some embodiment, unlike the hydrolytically stable thermoplastic resin, the polymer used for coating the metal fibers does not necessarily have to have excellent hydrolytic stability. However, the polymer selected for coating the metal fibers should maintain good adhesion to the metal fibers after exposure to high humidity (>70%) and moderate temperatures (55-90 C) over prolonged periods of time.

Optionally, prior to coating, the metal fibers can be cleaned or pre-treated with known coupling agents or adhesion promoters, including but not limited to chromate adhesion promoter, silane coupling agents, titanate coupling agents, acid washes, and the like. The major component of the fiber coating composition is essentially free of silanes, but may contain functionalized polymers that promote adhesion.

The presently disclosed composite materials are made by physically mixing dry pellets of the hydrolytically stable thermoplastic resin with pellets of the coated long conductive metal fibers. Preferably, the pellets are dried properly prior to processing in order to prevent loss of molecular weight. Various additives may also be added to the composite material to further improve the impact properties including: plasticizers, rubber modifiers, long fibers including long E-glass fibers, and miscible polymers. In some embodiments, the composite material also includes an impact modifier or maleated polyolefin. In some embodiments, maleated olefins are one type of useful impact modifier. Other impact modifiers useful in the present disclosure can be a variety of materials including, but not limited to core shell rubbers. In some embodiments, maleated olefins are also useful as a compatibilizer or as an adhesion promoter.

In some embodiments, the composite material also includes particles or glass fibers. In some embodiments, the composite material also includes particles or carbon fibers. In some embodiments, the composite material also includes a brominated bisphenol A polymer. In some embodiments, the composite material also includes a flame retardant. In some embodiments, the composite material may include a flow aid and UV stabilizer. These additives or materials can be added to either pellet, to the mixture of pellets, or both. In some embodiments, the composite materials of this invention are molded into parts by injection molding, compression molding, or overmolding.

In some embodiments, the pellets of the coated long conductive metal fibers are 30-50 wt % stainless steel fibers that are individually coated with the aforementioned polymer coating. The two different pellets are physically mixed and fed into an injection molding machine. During the process, pellets are heated above the glass transition or melting point of the coating polymer and the hydrolytically stable thermoplastic resin and they are mixed such that the metal fibers become dispersed in the host matrix. The thickness of the polymer coating on the metal fibers is highly dependent on mixing temperature, time, shear rate, and viscosity of the coating polymer itself. During the mixing and heating, the surface of the fiber retains the polymer coating and the thickness of the coating is dependent on the nature of the chemical absorption of the polymer and the viscosity. Coating polymers that have a higher viscosity will inherently result in a layer of polymer on the metal fiber surface that is thicker. It is believed that near the surface of the fiber, the two different polymers become melt entangled resulting in a gradient with increasing coating polymer content as the surface of the fiber is approached. The gradient will also depend on the degree of miscibility of the two polymers, temperature, viscosity, and shear conditions. For formulations using the polycarbonate-PDMS polymer as the hydrolytically stable resin in conjunction with standard polycarbonate coated stainless steel fibers, it is preferred that the pellet mixture is not overheated. This can cause degradation and/or loss of polycarbonate resin from the steel fiber surface. Without being bound by theory, it is believed that most polycarbonate-PDMS copolymers have poor adhesion to steel surfaces due to the PDMS segment in the polymer backbone, which essentially acts like an internal mold release.

The mixed melt of the hydrolytically stable thermoplastic resin with the coated metal fibers is transported via single screw and shot into a hot mold. The mold temperature and dwell time are dependent on numerous factors. It is desired that the final molded composite article has metal fibers uniformly dispersed in the hydrolytically stable thermoplastic resin and that the surface of the composite article contains no pitting and has the desired surface resistance. Furthermore, the injection molding machine is set up to avoid breaking of the metal fibers during the injection molding process. This includes the use of free-flowing check rings and low shear conditions. Preferably, the final molded part does not contain any voids. In addition, the present disclosure provides molded parts that have excellent impact properties at ambient cold temperatures after aging at elevated temperature and humidity. Empirically, it was found that polymeric materials with a notched Izod impact strength of 70 J/m at −25 degrees C. are generally needed for a larger injection molded part to withstand multiple drop impacts at subzero impact temperatures. The present disclosure provides materials and articles that can withstand multiple drop impact after long term exposure (>20 days) to elevated temperatures (60-90 degrees C.) and humidity (60-95% relative humidity). It is well known that the design and geometry of the part can have an effect on its resulting impact properties. Preferably, parts are designed so that they do not have sharp corners, sharp edges, or improperly designed ribs.

Use of the presently disclosed hydrolytically stable thermoplastic resin, such as for example PC-PDMS copolymer, in combination with the chemically different polymer coated conductive long metal fibers, such as stainless steel fibers, composite materials can be created having superior low temperature impact properties. The superior impact properties of composite articles made therefrom, such as injection molded parts, are retained after exposure to high temperature and high humidity for extended time periods (>25 days). Polycarbonate-polydimethylsiloxane copolymers are much more hydrolytically stable compared to polycarbonates that do not contain PDMS in their backbone. It is known that bisphenol A based polycarbonates that are hydrolytically unstable have poor impact properties after being exposed to high humidity conditions at temperatures greater than 60 C. The impact properties of such composites can be measured by known techniques, including Charpy and Izod impact tests using notched or unnotched specimens. Without being bound to a particular theory, it is believed that the use of a specific coating for the metal fibers allows for the creation of a fairly rigid, yet ductile and strong interface that still allows the hydrolytically stable thermoplastic resin to deform in a ductile manner when subject to an impact force. Because the composite material deforms in a ductile manner, the material has superior impact resistance and is less likely to crack or fail in a brittle manner after being subjected to large impact forces. These performance characteristics are particularly important for safety equipment including respirators, such as PAPRs, because small cracks after impact can lead to the ingress of chemicals, moisture, and/or dust which can result in damage to the equipment or user (including electrical fires or exposure to toxic chemicals).

The composite materials of this invention are useful for creating composite articles having utility in numerous applications including fire safety equipment, electrical parts and equipment, structural parts, automotive parts, electronics, EMI shielding, safety equipment including helmets, welding shields, personal respirators, and heat transfer materials. Because the presently disclosed materials retain high impact strength after rigorous exposure to heat and humidity, these materials are particularly useful for safety and electrical products that are used in extreme climates found throughout the world. The presently disclosed composite materials are also useful for creating mechanical parts such as gears, levers, knobs, screws, and clips. In some embodiments, the composite article is at least a portion of a powered air purifying respirator. In some embodiments, the composite article is at least a portion of a powered air purifying respirator comprising electronic devices of greater than 15 watts of available fault power. In some embodiments, the composite article is used for a portion of a power supply such as a battery pack. In some embodiments, the composite article comprises a portion of an intrinsically safe gas meter or gas detection device. In some embodiments, the composite article comprises a portion of an electrical battery pack.

EXAMPLES

Materials

| Designation | Description |
|---|---|
| EXL9134 | A copolymer of polycarbonate and polysiloxane with low temperature impact resistance down to −40° C., flame retardant properties (V-0 at 1.5 mm), UV stabilized, hydrolytically stable, with black colorant, available under the trade designation Lexan EXL9134-BK1A068 (black), or Lexan EXL9134-8T8D048 (grey) from Sabic Innovative Plastics, Pittsfield, Massachusetts |
| LSSMB | A masterbatch made up of a 50:50 weight percentage ratio of an injection molding grade of Bisphenol A polycarbonate and long fiber stainless steel type 302A, manufactured utilizing a long fiber pultrusion process that melt impregnates fibers with resin for maximum wet-out and bonding, available under the trade designation PlastiComp Complet LSF-50 1100 NAT F04-50-1100 from PlastiComp, Inc. Winona, Minnesota. |
| PA 9T | A semi aromatic polyamide resin based on a 9 carbon diamine and terephthalic acid commercially available as Genestar 9T, grade N1006A: from Kuraray North America, Houston, Texas. |
| LSSMB ABS | A masterbatch made up of a 50:50 weight percentage ratio of an injection molding grade of ABS resin (Cycolac MG29 from Sabic Innovative plastics) and long fiber stainless steel type 302, manufactured utilizing a long fiber pultrusion process that melt impregnates fibers with resin for maximum wet-out and bonding, custom compounded by PlastiComp, Inc., Winona, Minnesota. The fiber length and pellet length were both 12 mm. |
| LSSMB PBT | A masterbatch made up of a 50:50 weight percentage ratio of an injection molding grade of toughened PBT resin (Valox 337 from Sabic Innovative plastics) and long fiber stainless steel type 302, manufactured utilizing a long fiber pultrusion process that melt impregnates fibers with resin for maximum wet-out and bonding, custom compounded by PlastiComp, Inc., Winona, Minnesota. The pellet length and fiber length was 12 mm. |
| Valox 337 | Injection molding grade of Polybutylene terephthalate commercially available from Sabic Innovative Plastics, Pittsfield, Massachusetts. |
| Xenoy 5720u | Impact resistance polycarbonate alloy from Sabic Innovative Plastics, Pittsfield, Massachusetts. |

Test Methods
Intrinsically Safe Test Method

Figure 3:
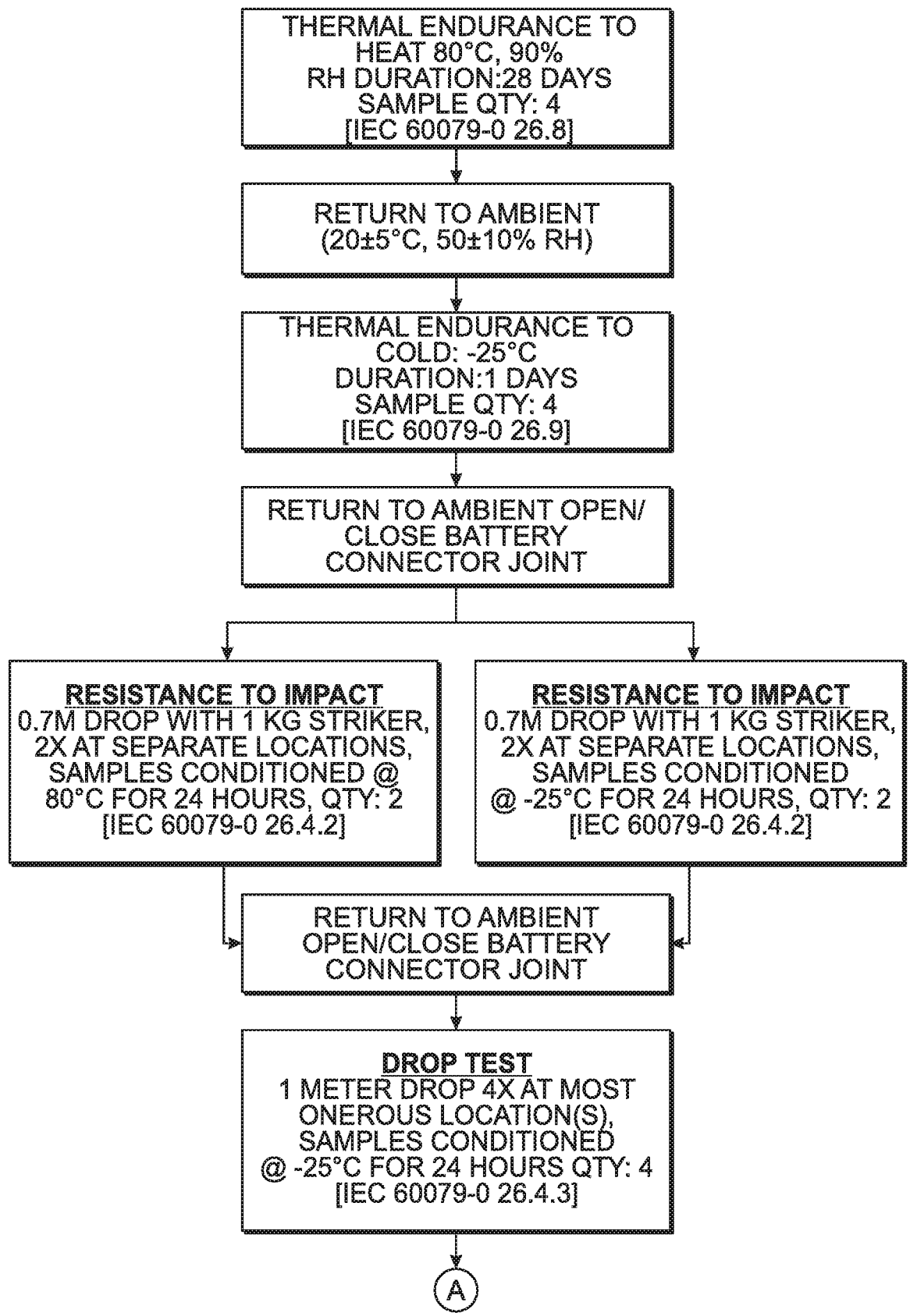
FIG. 3 is a flow chart of the process used in preparing Example 1.
Figure 3:
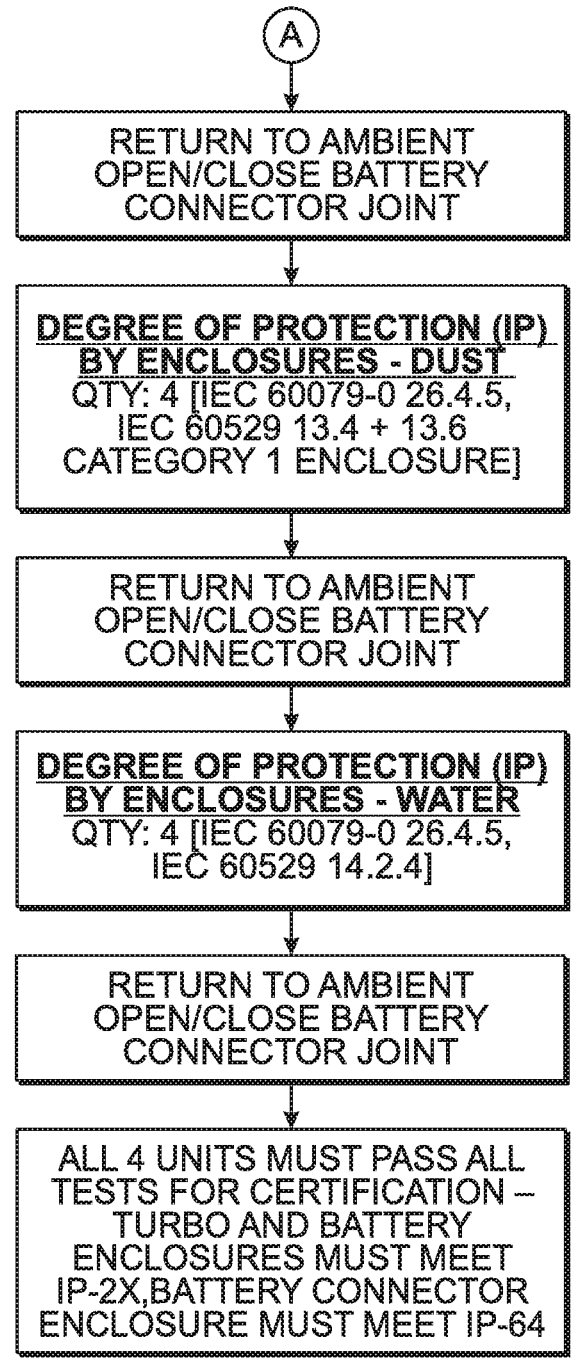

Tested in accordance with UL 60079-11 Standard for Safety—Explosive Atmospheres—Part 11: Equipment Protection by Intrinsic Safety "i", wherein UL 60079-11 section 6.1.3 Enclosures for Group III Apparatus requires four test units to be tested to Thermal Endurance to Heat (IEC 60079-0 section 26.8, at least 80° C., 90±5% relative humidity for 28 days) and Thermal Endurance to Cold (IEC 60079-0 section 26.9,—for 24 hours), wherein the NFPA 70 National Electrical Code requires a cold test temperature of −25±2° C. Note that the battery connector joint is opened and closed in between test sets per the flowchart shown in FIG. 3.

Two test units are then subjected to Resistance to Impact (IEC 60079-0 26.4.2) at hot test conditions (80°±2° C.), whereas the other two test units are subjected to Resistance to Impact (IEC 60079-0 26.4.2) at cold conditions (−25°±2° C.). Following which all four test units are subjected to a Drop Test (IEC 60079-0 26.4.3) at cold conditions (−25°±2° C.).

All four test units are next tested to IEC 60079-0 26.4.5 Degree of Protection (IP) by Enclosures, which is tested in accordance with IEC 60529 for both dust and water ingress protection. Degree of Protection (IP) by Enclosures for dust (IEC 60529 sections 13.4 and 13.6) is performed, followed by Degree of Protection (IP) by Enclosures for water (IEC 60529 section 14.2.4).

Upon completion of the tests, all four test samples must meet all the following requirements:
- the battery connector enclosure must meet first characteristic numeral 5 for protection against ingress of dust for a Category 1 enclosure (IEC 60529 sections 13.4 and 13.6)
- the battery connector enclosure must also meet second characteristic numeral 4 for protection against splashing water (IEC 60529 section 14.2.4)
- the turbo housing enclosure must meet first characteristic numeral 2 for protection against solid foreign objects of 12.5 mm diameter and greater (IEC 60529 section 13.2)
- the battery housing enclosure must meet first characteristic numeral 2 for protection against solid foreign objects of 12.5 mm diameter and greater (IEC 60529 section 13.2)
- at no time during the intrinsically safe test method can the battery unit be dislodged from the turbo unit Surface Resistance Test Method In addition to the above test requirements, PAPR components made using the presently disclosed composite material (turbo and battery housings) on all test units must meet one or more of the requirements described in IEC 60079-0 section 7.4.2 (when measured in accordance with IEC 60079-0 Section 26.13), to avoid build-up of electrostatic charge. Specifically, section 7.4.2 a) requires suitable selection of material such that the surface resistance is less than or equal to $10^9$ ohm measured at 50±5% relative humidity, or has a surface resistance less than or equal to $10^{11}$ ohm measured at 30±5% relative humidity.

Izod Impact Test Method (ASTM D256)

In this test method, polymer pellets and or physical blends of pellets are dried properly and molded into test bars with a geometry specified by ASTM D256. The test bars are then exposed to a specified set of environmental conditions and then impact tested according to ASTM D256. The reported impact values in this document are the mathematical mean of 5 test specimens.

Molding Methods and Conditions

The following table provides detail about the molding conditions used to mold Izod test bars. All temperatures including temperatures in the screw Zone (T1 to T4) are recorded in degrees F. All pressures are in pounds per square inch (PSI) and all times are in seconds.

|  | Example 12 | Example 9 | Comparative Example 2 | Comparative Example 1 | Example 10 |
|---|---|---|---|---|---|
| Material | Lexan EXL9134 | Lexan EXL9134 | Lexan EXL9134 | Lexan EXL9134 | Xenoy 5752u |
| SS MB Carrier | PC | PC | PBT-valox 337 | ABS-cycolac MG29 | PC |
| SS wt. % | 3 | 6 | 6 | 6 | 6 |
| Cycle Time | 40 | 32 | 32 | 32 | 40.71 |
| Fill Time | 1.33 | 1.62 | 1.9 | 1.9 | 1.29 |
| Metering Time | 13 | 13.1 | 13.1 | 13 | 7.1 |
| Cooling Time | 15 | 15 | 15 | 15 | 22 |
| Transfer Pressure | 1005 | 930 | 1050 | 860 | 1500 |
| Pack Pressure | 400 | 400 | 400 | 400 | 500 |
| Pack Time | 8 | 8 | 8 | 8 | 8.35 |
| Mold Temperature | 190 | 190 | 190 | 190 | 210 |
| Nozzle Temp | 570 | 580 | 580 | 580 | 520 |
| T1 | 565 | 575 | 575 | 575 | 515 |
| T2 | 560 | 570 | 570 | 570 | 510 |
| T3 | 540 | 560 | 560 | 560 | 505 |
| T4 | 540 | 560 | 560 | 560 | 500 |

|  | Comparative Example 3 | Example 11 | Example 12 | Example 12 |
|---|---|---|---|---|
| Material | Valox | Nylon 9T | Lexan EXL9134 | Lexan EXL9134 |
| SS MB Carrier | PC | PC | PC | PC |
| SS % | 6 | 6 | 9 | 11 |
| Cycle Time | 40.26 | 41 | 32 | 32 |
| Fill Time | 1.39 | 1.29 | 1.62 | 1.62 |
| Metering Time | 6.63 | 7.1 | 6.94 | 7.7 |
| Cooling Time | 20 | 22 | 15 | 15 |
| Transfer Pressure | 1360 | 1500 | 920 | 1123 |
| Pack Pressure | 500 | 500 | 400 | 400 |
| Pack Time | 10.2 | 8 | 8 | 8 |
| Mold Temperature | 150 | 210 | 190 | 190 |
| Nozzle Temp | 475 | 590 | 580 | 580 |
| T1 | 475 | 590 | 575 | 575 |

-continued

| | | | | |
|---|---|---|---|---|
| T2 | 475 | 590 | 570 | 570 |
| T3 | 475 | 585 | 560 | 560 |
| T4 | 475 | 585 | 560 | 560 |

Examples 1 to 8

EXL9134 was blended with LSSMB in a weight percentage ratio of 22:3, resulting in a mixture of 88% EXL9134 and 12% LSSMB. Given that the LSSMB is a 50:50 mixture of polycarbonate and long stainless steel fibers, the net result is 88% by weight polycarbonate-polysiloxane copolymer (with flame retardant and UV stabilizer), 6% by weight polycarbonate polymer, and 6% by weight of the long stainless steel fibers. Both polymeric materials were dried in a dessicant type drier for 3 hours at 120 degrees C. prior to blending and molding.

This material was injection molded into PAPR components including the front and rear turbo housings, along with the lid and battery base housings. A modified free-flow check ring was utilized on the injection molding machine to reduce shear and help retain fiber length in the molded parts. The blended composite material was fed into the injection molding machine in small batches (≤2.72 kg), and stirred periodically to keep the LSSMB pellets evenly distributed within the EXL9134 pellets. Due to the size and density disparity of the two different pellets, care is taken to avoid separation. This may also be achieved through use of a gravimetric blender on the injection molding machine.

Examples 2 through 8 were created using the same materials and steps as detailed above for Example 1.

Examples 1 to 8 were then built into full assembly units for subsequent conditioning and testing. Note that properly weighted dummy battery cells were used in place of actual battery cells. The turbo housings were secured together using an adhesive (such as the adhesive under the trade designation "3M Scotch-Weld Acrylic DP820" from 3M Company, St. Paul, Minn.), whereas the battery housings were secured together via ultrasonic welding. The battery was then secured to the turbo using an alloy-steel fastener, torqued to ~1.13 N-m. Test results are shown below in Table 1.

TABLE 1

| Example | Resistance to Impact | Drop Test | Degree of Protection (IP) - Dust | Degree of Protection (IP) - Water | Surface Resistance |
|---|---|---|---|---|---|
| 1 | PASS | PASS | PASS | PASS | PASS |
| 2 | PASS | PASS | PASS | PASS | PASS |
| 3 | PASS | PASS | PASS | PASS | PASS |
| 4 | PASS | PASS | PASS | PASS | PASS |
| 5 | PASS | PASS | PASS | PASS | PASS |
| 6 | PASS | PASS | PASS | PASS | PASS |
| 7 | PASS | PASS | PASS | PASS | PASS |
| 8 | PASS | PASS | PASS | PASS | PASS |

Example 9

A composition according to Example 1 was formulated and molded into impact test bars suitable for Izod impact testing (ASTM D256).

Comparative Example 1

A formulation containing 6 wt % stainless steel fibers in 88 wt % EXL 9134 was created by blending LSSMB ABS with Lexan EXL 9134 at a weight ratio of 12:88. This composition using mixed pellets was molded into Izod impact tests bars using an injection molding process conditions with a melt temperature of 285 degrees C.

Comparative Example 2

A formulation containing 6 wt % long stainless steel fibers in 88 wt % EXL9134 with a coating of toughened polybutylene terephthalate, PBT, (6 wt % of the total composition) was molded into standard Izod test bars. The molded test bars of Example 9 and Comparative Examples 1 and 2 were subjected to an environmental exposure of 90% RH and 80 degrees C. for 4 weeks and then tested as notched and unnotched specimens at 23 C and −25 degrees according to ASTM D256.

Table 2 shows the results of impact testing at both temperatures after aging. Example 9 shows the superior notched and unnotched Izod impact properties of a formulation according to this invention compared to similar comparative formulations using coated steel fibers with different polymers. The composition according to Example 9 is static dissipative, flame retardant, and has very good impact resistance at low temperatures. Comparative Examples 1 and 2 use polymers (ABS and PBT) that are commonly alloyed with polycarbonates. However, it is believed that these polymers do not adhere well to stainless steel fibers and do not form a strong interface at the fiber surface. As a result, the interface acts as a weak boundary layer and results in a composite material with inferior impact properties. This effect is particularly noticed with notched specimens at −25 degrees C. as shown in Table 2 where both comparative examples had a measured notched Izod impact values of <40 Jim after aging.

TABLE 2

| Example | Fiber coating | Notched Izod (J/m) at −25 C. | Unnotched Izod at 23 C. | Unnotched Izod at −25 C. |
|---|---|---|---|---|
| Example 9 | polycarbonate | 82 | 890 | 808 |
| Comparative Example 1 | ABS | 39 | 444 | 335 |
| Comparative Example 2 | PBT | 36 | 541 | 333 |

Example 10

This example shows that a polycarbonate alloy may be used as the hydrolytically stable resin according to this invention. Test bars were made by dry blending pellets of Sabic 5720 and LSSMD at a weight ratio of 88:12 followed by injection molding into ASTM D256 Izod test bars. These were placed into an environmental chamber for 28 days at 80 degrees C. and 90% relative humidity. The test bars were then tested according to AST D256 at −25 degrees C. The results are shown in table 3.

Example 11

This example shows that a semi-aromatic nylon may be used as the hydrolytically stable resin according to this invention. Test bars were molded using Genestar 9T as the hydrolytically stable resin in a similar manner to Example 10. The results are shown in Table 3. This material shows excellent notched Izod results at −25 degrees C. after aging.

Comparative Example 3

This example shows that toughened PBT is not suitable as the hydrolytically stable resin according to this invention. Formulations were using the same method described in Example 10 except a toughened PBT resin was used in place of the polycarbonate alloy. The formulation of this Comparative Example 3 shows inferior impact properties with low impact strength at −25 degrees C. after aging at 80 C, 90% RH. The results are shown in Table 3.

TABLE 3

| | Base resin (88 wt %) with 6 wt % long stainless steel fibers | Notched Izod (J/M) at −25 C. after aging |
|---|---|---|
| Example 9 | Polycarbonate-PDMS (Lexan EXL) | 82 |
| Example 10 | Polycarbonate alloy (Xenoy 5720u) | 123 |
| Example 11 | Semi-aromatic nylon (Genestar 9T) | 108 |
| Comparative Example 3 | Toughened PBT | 63 |

Example 12

Example 12 shows the effect of stainless fiber content on the impact properties of the composite material. Composite material Izod test bars were made according to Example 3 and the metal fiber content was varied by changing the blending ratio of EXL to LSSMB. Table 4 shows the impact properties after aging. All materials show very high levels of unnotched impact strength at −25 C. However, composites materials using Lexan EXL have higher unnotched Izod impact strength at lower fiber concentrations. Composite materials with 11 wt % stainless fiber according to this invention are still useful, particularly for making smaller and less complex injection molded parts. The unnotched impact strength of these composite materials as shown in Table 4 are still superior to many types of widely used engineering thermoplastics including ABS and some types of nylons. These materials are thus useful for a wide variety of applications.

TABLE 4

| Wt. % long stainless steel fibers in EXL | Unnotched Izod (J/M) at −25 C. after aging | Notched Izod (J/M) at −25 C. after aging |
|---|---|---|
| 3 | 1338 | 103 |
| 6 | 891 | 82 |
| 9 | 842 | 63 |
| 11 | 679 | 74 |

Various modifications and alterations of this invention will become apparent to those skilled in the art without departing from the scope and spirit of this invention.

What is claimed is:

1. A composite article comprising a composite material comprising:

a) 60 wt % to 98 wt % of a hydrolytically stable thermoplastic resin; and
b) 1 wt % to 11 wt % long conductive metal fibers individually coated with a polymer selected from at least one of aromatic polycarbonates, aromatic polycarbonate alloys, aromatic polyethers, maleated polyolefins, semi-aromatic nylons, stabilized nylons, and combinations thereof, the polymer coating the long conductive metal fibers has a different composition than the hydrolytically stable thermoplastic resin.

2. The composite article of claim 1 wherein the long conductive metal fibers comprise long stainless steel fibers.

3. The composite article of claim 1 wherein the hydrolytically stable thermoplastic resin is selected from at least one of stabilized aliphatic nylons, semi-aromatic nylons, aromatic polyethers, and hydrolytically stable polycarbonate alloys.

4. The composite article of claim 1 wherein the hydrolytically stable thermoplastic resin comprises polycarbonate-polysiloxane copolymer.

5. The composite article of claim 1 wherein the polymer used to coat the long conductive metal fibers comprises bisphenol A polycarbonate polymer or copolymers.

6. The composite article of claim 1 wherein the long conductive metal fibers are >1 mm in length.

7. The composite article of claim 1 wherein the long conductive fibers have an L/D ratio greater than or equal to 100.

8. The composite article of claim 1 wherein the composite material further comprises an impact modifier or maleated polyolefin.

9. The composite article of claim 1 wherein the composite material further comprises carbon black.

10. The composite article of claim 1 wherein the composite material further comprises particles or glass fibers.

11. The composite article of claim 1 wherein the composite material further comprises particles or carbon fibers.

12. The composite article of claim 1 wherein the composite material further comprises a brominated bisphenol A polymer.

13. The composite article of claim 1 wherein the composite material further comprises a flame retardant.

14. The composite article of claim 1 where the long conductive metal fibers comprise aluminum, an aluminum alloy, copper, or a copper alloy.

15. The composite article of claim 1 wherein an outer surface of the composite article has a surface resistance less than or equal to $10^9$ ohm measured at 50±5% relative humidity, or has a surface resistance less than or equal to $10^{11}$ ohm measured at 30±5% relative humidity when measured in accordance with IEC 60079-0 Section 26.13.

16. The composite article of claim 1 wherein at least one surface of the composite article comprises long conductive metal fibers aligned in a radial pattern, and further wherein the radial pattern covers greater than 50% of the surface area of the composite article.

17. The composite article of claim 1 wherein at least one surface of the composite article comprises long conductive metal fibers aligned unidirectionally on the at least one surface.

18. The composite article of claim 1 wherein the composite article meets IEC 60079 Test.

19. The composite article of claim 1 wherein the composite article is at least a portion of a powered air purifying respirator.

20. The composite article of claim 1 wherein the composite article comprises at least a portion of an intrinsically safe powered air purifying respirator.

\* \* \* \* \*